(12) United States Patent
Hunter et al.

(10) Patent No.: US 9,190,803 B2
(45) Date of Patent: Nov. 17, 2015

(54) EXTERNAL CAVITY LASER

(71) Applicant: Akonia Holographics, LLC, Longmont, CO (US)

(72) Inventors: Susan Hunter, Fort Collins, CO (US); Vladimir Krneta, Wilmington, MA (US); Jason Ensher, Lafayette, CO (US); Aaron Wegner, Longmont, CO (US)

(73) Assignee: Akonia Holographics, LLC, Longmont, CO (US)

( * ) Notice: Subject to any disclaimer, the term of this patent is extended or adjusted under 35 U.S.C. 154(b) by 52 days.

(21) Appl. No.: 14/453,529

(22) Filed: Aug. 6, 2014

(65) Prior Publication Data

US 2015/0222082 A1 Aug. 6, 2015

Related U.S. Application Data

(62) Division of application No. 11/716,002, filed on Mar. 9, 2007, now abandoned.

(60) Provisional application No. 60/780,354, filed on Mar. 9, 2006.

(51) Int. Cl.
*H01S 3/105* (2006.01)
*H01S 3/08* (2006.01)
*H01S 3/1055* (2006.01)
(Continued)

(52) U.S. Cl.
CPC ........... *H01S 3/1055* (2013.01); *H01S 3/08009* (2013.01); *H01S 3/139* (2013.01); *H01S 3/0014* (2013.01); *H01S 3/0621* (2013.01);
(Continued)

(58) Field of Classification Search
CPC ... H01S 3/1055; H01S 3/0621; H01S 3/0014; H01S 3/08009; H01S 3/139; H01S 3/08086; H01S 3/086; H01S 5/141
See application file for complete search history.

(56) References Cited

U.S. PATENT DOCUMENTS 3,603,690 A 9/1971 Hard
3,744,871 A 7/1973 Takeda et al.
(Continued)

FOREIGN PATENT DOCUMENTS

JP H03-241883 10/1991
JP H03-279821 12/1991
(Continued)

OTHER PUBLICATIONS

W.R. Trutna, Jr., and L.F. Stokes, "Continuously Tuned External Cavity Semiconductor Laser", Journal of Lightwave Technology, Aug. 1993, 1279-1286, vol. 11, No. 8.
(Continued)

*Primary Examiner* — Tod T Van Roy
*Assistant Examiner* — Marcia Golub-Miller
(74) *Attorney, Agent, or Firm* — Albert Haegele

(57) ABSTRACT

Embodiments of systems and methods are provided for a tunable laser device. The tunable laser device may include a diffraction grating connected to a pivot arm that pivots the diffraction grating about a pivot point to tune the laser device. In pivoting the diffraction grating about the pivot point, both the wavelength to which the diffraction grating is tuned and the length of the optical cavity may be changed. The length of the pivot arm may be selected to reduce the number of mode hops of the tunable laser device when tuning the laser device over its tuning range.

5 Claims, 13 Drawing Sheets

(51) Int. Cl.
*H01S 3/139* (2006.01)
*H01S 5/14* (2006.01)
*H01S 3/06* (2006.01)
*H01S 3/00* (2006.01)
*H01S 3/086* (2006.01)

(52) U.S. Cl.
CPC ............ *H01S 3/086* (2013.01); *H01S 3/08086* (2013.01); *H01S 5/141* (2013.01)

(56) References Cited

U.S. PATENT DOCUMENTS

| | | | |
|---|---|---|---|
| 3,829,193 | A | 8/1974 | Tsunoda et al. |
| 3,854,791 | A | 12/1974 | Takeda et al. |
| 3,917,380 | A | 11/1975 | Kato et al. |
| 4,037,918 | A | 7/1977 | Kato |
| 4,143,937 | A | 3/1979 | Yonezawa et al. |
| 5,058,124 | A | 10/1991 | Cameron et al. |
| 5,510,912 | A | 4/1996 | Blaum et al. |
| 5,627,664 | A | 5/1997 | Trisnadi |
| 5,727,226 | A | 3/1998 | Blaum et al. |
| 5,956,302 | A | 9/1999 | Maeda et al. |
| 6,018,402 | A | 1/2000 | Campbell et al. |
| 6,047,008 | A | 4/2000 | Funakawa |
| 6,103,454 | A | 8/2000 | Dhar et al. |
| 6,163,391 | A | 12/2000 | Curtis et al. |
| 6,281,993 | B1 | 8/2001 | Bernal et al. |
| 6,310,850 | B1 | 10/2001 | Sochava et al. |
| 6,414,763 | B1 | 7/2002 | Hesselink et al. |
| 6,449,627 | B1 | 9/2002 | Baer et al. |
| 6,482,551 | B1 | 11/2002 | Dhar et al. |
| 6,614,566 | B1 | 9/2003 | Curtis et al. |
| 6,650,447 | B2 | 11/2003 | Curtis et al. |
| 6,674,555 | B1 | 1/2004 | Curtis et al. |
| 6,697,180 | B1 | 2/2004 | Wilson et al. |
| 6,700,686 | B2 | 3/2004 | King et al. |
| 6,721,076 | B2 | 4/2004 | King et al. |
| 6,731,661 | B2 | 5/2004 | Trutna, Jr. |
| 6,743,552 | B2 | 6/2004 | Setthachayanon et al. |
| 6,765,061 | B2 | 7/2004 | Dhar et al. |
| 6,780,546 | B2 | 8/2004 | Trentler et al. |
| 6,798,547 | B2 | 9/2004 | Wilson et al. |
| 6,856,461 | B2 | 2/2005 | Curtis |
| 7,092,133 | B2 | 8/2006 | Anderson et al. |
| 2002/0110053 | A1 | 8/2002 | Araki et al. |
| 2003/0206320 | A1 | 11/2003 | Cole et al. |
| 2003/0231691 | A1 | 12/2003 | Marron |
| 2004/0027625 | A1 | 2/2004 | Trentler et al. |
| 2004/0165639 | A1 | 8/2004 | Lang et al. |
| 2005/0068880 | A1 | 3/2005 | Hibino |

FOREIGN PATENT DOCUMENTS

| | | |
|---|---|---|
| JP | H10-107377 | 4/1998 |
| JP | H11-068249 | 3/1999 |
| JP | 2003-174221 | 6/2003 |
| JP | 2003-324227 | 11/2003 |
| JP | 2005-175049 | 6/2005 |

OTHER PUBLICATIONS

Office Action received for Japanese Patent Application No. 2008-558425, mailed Jul. 9, 2013, 8 pages (5 pages of English translation and 3 pages of Official copy).

Final Office Action received for Japanese Patent Application No. 2008-558425, mailed Jun. 3, 2014, 7 pages (4 pages of English translation and 3 pages of original in Japanese).

Office Action received for Japanese Patent Application No. 2014-204732, mailed Jun. 2, 2015, 8 pages (5 pages of English translation and 3 pages of Official copy).

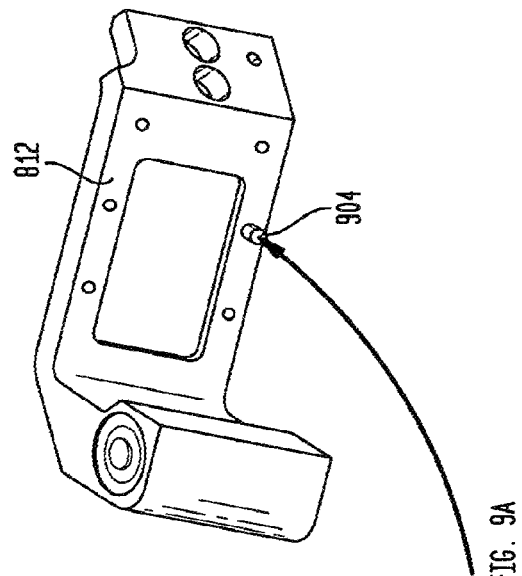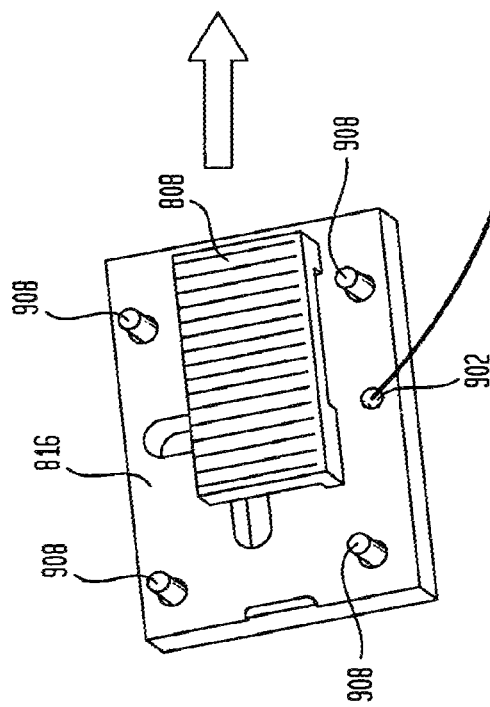

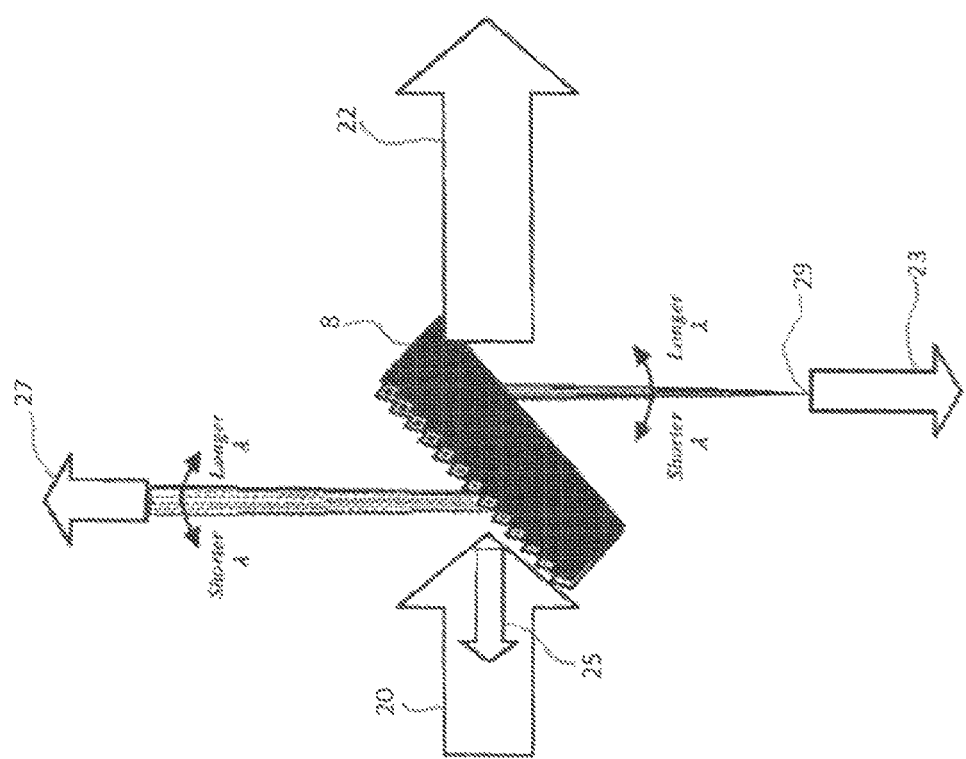

EXTERNAL CAVITY LASER

CROSS-REFERENCE TO RELATED APPLICATIONS

This application makes reference to and claims the priority date of co-pending U.S. patent application Ser. No. 11/716,002, entitled "External Cavity Laser", filed Mar. 9, 2007, which claims priority to U.S. Patent Application 60/780,354, also entitled "External Cavity laser", filed Mar. 9, 2006 The entire disclosure and contents of the above applications are hereby incorporated by reference.

BACKGROUND

1. Field of the Invention

The present invention relates generally to lasers, and more particularly, to external cavity lasers.

2. Related Art

The use of an external laser cavity with a spectrally selective element has been used for several decades to create a laser with a narrower spectral linewidth than is available with the non-wavelength selective mirrors in the laser cavity of the typical laser. In addition, the tenability of the spectrally selective element may create a laser with an agile wavelength that may be both narrow in line width and cover a broad tuning range. The spectrally selective element in many non-integrated external cavity lasers may be a diffraction grating. These diffraction gratings may be designed to meet a broad range of laser cavity needs such as size, efficiency, and dispersion. The tuning of the wavelength of the laser may be achieved by adjusting the grating angle of the diffraction grating with respect to the laser beam.

Tuning such a laser by merely adjusting the grating angle may result in the laser occasionally "hopping" from one cavity mode to another cavity mode. A cavity mode (referred to hereafter as a "mode") refers to the integral number of half wavelengths of light at the tuned wavelength that fit within the optical cavity of the laser. Further, these hops from one mode to another are referred to as mode hops. Mode hops may result in the instability of the laser output by the laser system. Thus, it is desirable to reduce the number of mode hops that exist across a tuning range of the laser system.

Accordingly, there is a need for laser systems with improved mode hop performance over the tuning range.

SUMMARY

According to a first broad aspect of the present invention, there is provided a laser system comprising:

a light source which provides light;

a lens which collimates the light to provide a collimated coherent light beam;

a diffraction grating which reflects at least a portion of a wavelength of light of the collimated coherent light beam towards the light source; and a pivot arm connected to the diffraction grating, wherein the pivot arm pivots the diffraction grating to thereby adjust the wavelength of light reflected by the diffraction grating towards the light source as well as adjusting an optical path length.

According to a second broad aspect of the invention, there is provided a method for generating a coherent light beam comprising the following steps:

(a) providing a collimated coherent light beam; and (b) pivoting a pivot arm connected to a diffraction grating to adjust a position of the diffraction grating, thereby adjusting a wavelength of light of the collimated coherent light beam reflected by the diffraction grating as well as adjusting an optical path length.

According to a third broad aspect of the invention, there is provided a laser system for generating a coherent light beam comprising:

means for providing a collimated coherent light beam;

means for reflecting at least a portion of a wavelength of light of the collimated coherent light beam; and means for adjusting a position of the reflecting means to thereby adjust a wavelength of light of the collimated coherent light beam reflected by the reflecting means as well as adjusting an optical path length for the laser system.

BRIEF DESCRIPTION OF THE DRAWINGS

The invention will be described in conjunction with the accompanying drawings, in which:

FIGS. 9A and 9B illustrate an exemplary mount, transmission grating and first portion of a pivot arm, in accordance with embodiments of methods and systems of the present invention.

FIG. 12 illustrates a transmission diffraction grating, in accordance with embodiments of the present invention.

DETAILED DESCRIPTION

Figure 1:
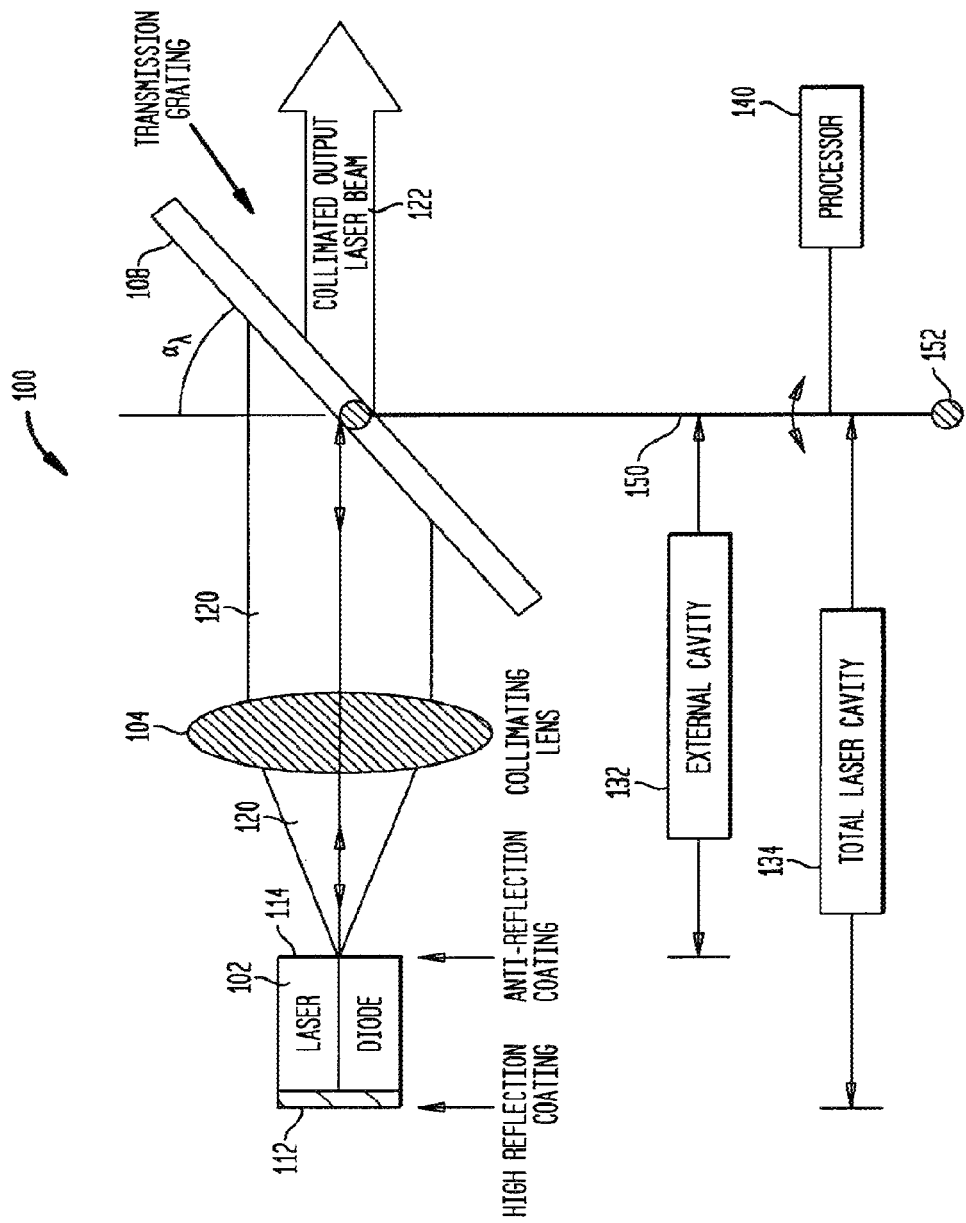
FIG. 1 illustrates an exemplary laser system, in accordance with embodiments of methods and systems of the present invention.

It is advantageous to define several terms before describing the invention. It should be appreciated that the following definitions are used throughout this application.

DEFINITIONS

Where the definition of terms departs from the commonly used meaning of the term, applicant intends to utilize the definitions provided below, unless specifically indicated.

For the purposes of the present invention, the term "light source" refers to a source of electromagnetic radiation having a single wavelength or multiple wavelengths. The light source may be from a laser, a laser diode, one or more light emitting diodes (LEDs), etc.

For the purposes of the present invention, the term "coherent light beam" refers to a beam of light including waves with a particular (e.g., constant) phase relationship, such as, for example, a laser beam.

For the purposes of the present invention, the term "processor" refers to a device capable of executing instructions and/or implementing logic. Exemplary processors may include application specific integrated circuits (ASIC), central processing units, microprocessors, such as, for example, microprocessors commercially available from Intel and AMD, etc.

For the purposes of the present invention, the term "reflective device" refers to a device capable of reflecting light. Exemplary reflective devices comprise mirrors, diffraction gratings, including, for example, tunable transmission diffraction gratings, etc.

For the purposes of the present invention, the term "diffraction grating" refers to a device whose optical properties are periodically modulated which results in the incoming light to exit the grating with an angle that is dependent on the wavelength. Exemplary diffraction gratings may include reflective or transmission gratings.

For the purposes of the present invention, the term "transmission grating" refers to a diffraction grating that is on a transparent substrate which permits the non-diffracted light to be transmitted through the substrate. Exemplary transmission gratings comprise devices capable of diffracting a portion of light at a particular wavelength that passes through the device back along the same path on which the incoming light traveled, for example, by adjusting an angle of the device.

For the purpose of the present invention, the term "tunable transmission grating" refers to a Transmission grating in which the particular wavelength of light reflected may be adjusted.

For the purposes of the present invention, the term "reflective grating" refers to a diffraction grating that is on a reflective substrate which permits the non-diffracted light to be reflected from the substrate.

For the purpose of the present invention, the term "collimated light beam" refers to a beam of light comprising surfaces of approximately constant phase that are approximately parallel and normal to the direction of propagation. For example, in embodiments, a collimated light beam may have surfaces of constant phase that are as close to parallel as possible and normal to the direction of propagation.

For the purpose of the present invention, the term "tune" refers to adjusting a device to a desired state. For example, in exemplary embodiments, a diffraction grating may be tuned by adjusting the particular wavelength reflected or transmitted by the diffraction grating to a desired wavelength.

For the purpose of the present invention, the term "optical cavity" refers to a space between two reflective devices. Exemplary optical cavities may comprise the space between reflective devices in a laser system, such as, for example, the space between a reflective coating on a facet of a laser diode and a transmission grating, diffraction grating, mirror, etc.

For the purpose of the present invention, the term "external cavity" refers to a portion of an optical cavity that is external to a component of a laser system that is the source of the photons and optical gain. Exemplary external cavities comprise the portion of an optical cavity of a laser system between a laser diode and a reflective device (e.g., a Transmission grating) external to the laser diode, and usually provide control over the longitudinal and/or transverse mode structure of the laser.

For the purpose of the present invention, the term "mode number" refers to the number of half wavelengths of a particular wavelength of light that fits within an optical cavity.

For the purpose of the present invention, the term "mode hop" refers to an integral change in the mode number that occurs during tuning of laser.

For the purpose of the present invention, the term "substrate" refers to a layer of material. Exemplary substrates may include, for example, transparent materials, such as, for example, glass, plastic, etc.

DESCRIPTION

FIG. 1 illustrates an exemplary laser system, in accordance with embodiments of the methods and systems of the present invention. As illustrated, laser system 100 may comprise a laser diode 102, a collimating lens 104, a transmission grating 108, a processor 140, and a pivot arm 150. Laser system 100 may be, for example a laser system such as used in holographic memory systems. Laser diode 102 may be, for example, any type of device capable of producing a coherent light beam, such as, for example, a semiconductor device capable of producing a coherent light beam. Further, laser diode 102 may include a highly reflective coating 112 (e.g., R>98%) on its facet opposite the external cavity 132 and an anti-reflective coating 114 (e.g., R<0.5%) on laser diode 102's other facet. Processor 140 may be any type of processor, such as, for example a commercially available microprocessor and be used, for example, to control (e.g., move) pivot arm 150.

Collimating lens 104 may be a high quality collimating lens, such as those commercially available. Although not illustrated in this embodiment, an optional half wave plate (HWP), such as, for example, any type of commercially available HWP, may be located between lens 104 and transmission grating 108. Transmission grating 108 may be, for example, a transmission grating such as described in M. Merimaa, H. Talvitie, P. Laakkonen, M. Kuittinen, I. Tittonen, and E. Ikonen, "Compact External-Cavity Laser with a Novel Transmission Geometry," Optics Communications 174:175-180 (Jan. 15, 2000). Further, in laser system 100 transmission grating 108 may have a reflectivity of, for example, from about 10 to about 50%. Although the present embodiments are described as using a transmission grating, in other embodiments other types of spectrum selective elements may be used, such as for example, other types of a diffraction gratings, such as, for example, a reflective grating.

Pivot arm 150 may be connected to transmission grating 108 so as to pivot about a pivot point 152 so that transmission grating 108 is pivoted (e.g., to rotated) to an angular position to tune laser system 100 to a desired wavelength. A further description of an exemplary transmission grating 108 is provided below, along with an explanation regarding tuning laser system 100 by pivoting transmission grating 108 to the desired angular position using pivot arm 150.

In operation, laser diode 102 may generate a coherent light beam 120 that may be achromatically collimated by collimating lens 104. Pivotable transmission grating 108 may then be used to tune laser system 100 to a desired wavelength of light by diffracting only a selected wavelength of coherent light beam 120 directly back towards laser diode 102. Wavelengths of light other than the desired wavelength (i.e., the wavelength to which laser system 100 is to be tuned) will be diffracted at other angles. Only the reflected light at the desired wavelength may then pass back through collimating lens 104 and laser diode 102 where it may then be reflected back by reflective coating 112. Since a laser amplifies the photon energy on each round trip through the total laser cavity 134, transmission grating 108 of the external cavity 132 of laser system 100 may be used to selectively allow only one (or a few) wavelengths to dominate (i.e., lase).

As noted above, transmission grating 108 may be able to diffract about 10% to about 50% of the light of the desired wavelength back to the light source, which is for example, a reflectivity of between about 10% and about 50% for the output coupler of the external cavity laser system described in the present embodiment of laser system 100. Thus, in operation, tunable transmission grating 108 may transmit almost all of the light incident upon it except for the diffraction of from about 10 to about 50% of light back into the laser cavity and any other light that is diffracted or reflected at other angles due to the design of the diffraction grating or reflective coatings. In addition, transmission grating 108 may allow the remaining light (i.e., from about 50 to about 90%) at the tuned wavelength (as well as all other wavelengths of light) to pass through the transmission grating 108 to form collimated output laser beam 122.

The following provides a more detailed description of an exemplary method for designing a laser system 100 using a pivotable transmission grating 108 for tuning. In the description below, laser diode 102 will be described with reference to a desired center wavelength, $\lambda_{center}$ and a tuning range $\Delta\lambda_{total}$ in terms of nanometers (nm). Further, for simplicity in the description below, the center wavelength will be set in the center of the turning range. Laser diode 102 may also have a minimum wavelength, $\lambda_{min}=\lambda_{center}-\Delta\lambda_{half}$ and a maximum wavelength, $\Delta_{min}=\lambda_{center}+\Delta\lambda_{half}$, where $\Delta\lambda_{half}=\Delta\lambda_{total}/2$.

Transmission grating 108 may comprise a plurality of equally spaced and parallel gratings. The density of grating lines, G, in lines/nm, may be defined as $G=2*\sin(\alpha_\lambda)/\lambda_0$, where $\alpha_\lambda$ is the Littrow angle. Thus, for example, for a Littrow angle, $\alpha_\lambda=45$ degree, $G=\sqrt{2}/\lambda_0$. Accordingly, in an exemplary system where $\lambda_{center}=405$ nm and $\alpha_\lambda=45$ degrees, G=3492 lines/mm.

Figure 2A:
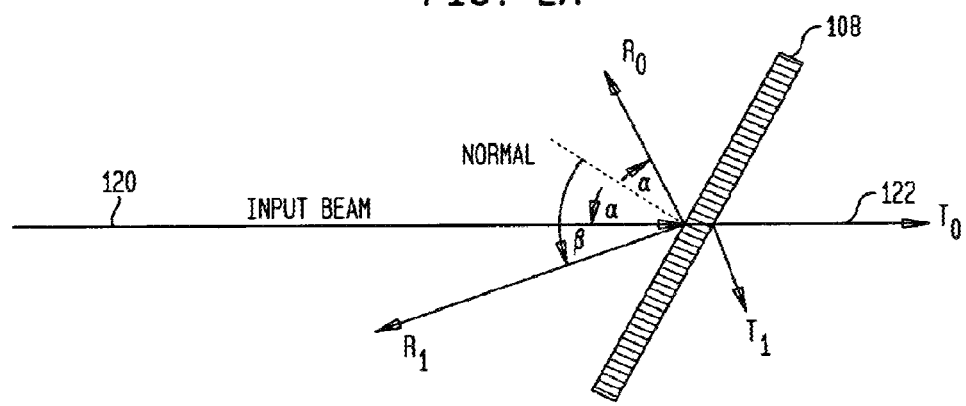
FIGS. 2A and 2B provide a simplified diagram for illustrating a Littrow angle, in accordance with embodiments of methods and systems of the present invention.
Figure 2B:
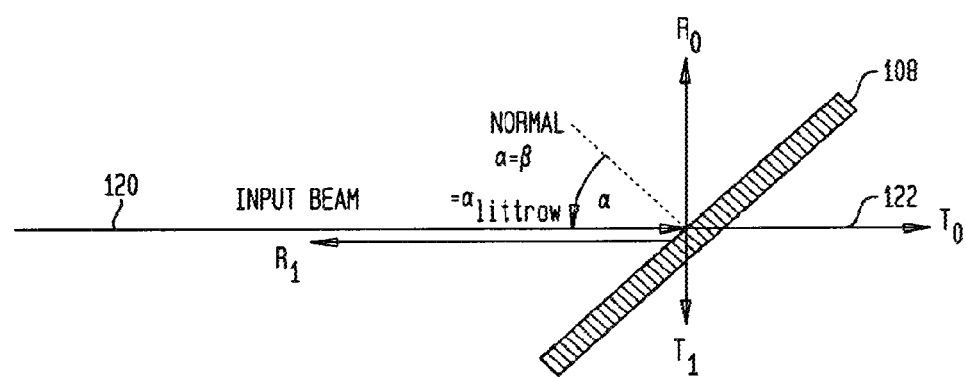

FIGS. 2A and 2B provide a simplified diagram for illustrating the Littrow angle, $\alpha$. The Littrow angle, $\alpha$, for transmission grating 108 is the angle at which transmission grating 108 will diffract the wavelength of interest directly back onto itself (i.e., transmission grating 108 will diffract the wavelength of interest back along the optical axis). In FIG. 2A, transmission grating 108 is not angled at the Littrow angle, $\alpha_\lambda$, for the wavelength of interest, but instead is set at a different angle, $\alpha$. This results in the wavelength of interest, $\lambda_{center}$, being reflected not along the optical axis but instead as shown by diffracted power, $R_1$, at the angle $\beta$. In FIG. 2B, transmission grating 108, in contrast, is positioned at the Littrow angle, $\alpha_\lambda$, for the wavelength of interest, $\lambda_{center}$, and accordingly reflects the wavelength of interest, $\lambda_{center}$, back along the optical axis as shown by line $R_1$ at the angle $\alpha_\lambda$.

Also, illustrated in FIGS. 2A and 2B, are a transmitted power, $T_0$, a transmitted power, $T_1$, and a reflected power, $R_0$, which are the most common pathways that light travels after a diffraction grating. The subscript "0" is used to denote just the natural direction that light will travel when it encounters a transparent substrate with a different index of refraction. The other two beams have the "1" subscript which denotes that the light has been diffracted by the grating into various angles. The general grating equation is: $Gm\lambda 1=\sin(\alpha)+\sin(\beta)$, where m is the diffraction order and must be an integer. This equation and other diffraction grating details can be found in the book "Diffraction Grating Handbook", Christopher Palmer and Erwin Loewen, Newport Corporation, 2005, which is hereby incorporated by reference.

The following provides a description of an exemplary method for determining the placement of the pivot point 152 of transmission grating 108 and the length, P, of pivot arm 150. For simplicity, the first reflected order of diffraction for the transmission grating 108 will be assumed to be the order of interest in the below description, m=1 and therefore the $R_1$ beam is the one that defines the external cavity laser optical path.

Referring back to FIG. 1, the optical cavity length, L, is the optical path length for a photon of wavelength $\lambda$ traveling down the center of laser cavity 134 and takes into account the path length and index of refraction for each of the materials that the path traverses as shown in FIG. 1. For example, the optical cavity length, L, for laser system 100 may be defined as follows:

$$L=(L_{diode}*n_{diode})+(L_{air}*n_{air})+(L_{Lens\_material\_n}*n_{lens\_material\_n})$$

where $L_{diode}$=physical length of the laser diode along the central optical path, $n_{diode}$=the index of refraction at the center wavelength, $\lambda_{center}$, of laser diode 102, $L_{air}$=physical length of the space along the central optical path that is air, $n_{air}$=the index of refraction at $\lambda_{center}$ of the air, $L_{lens\_material\_n}$=physical length of lens 104 along the central optical path, and $n_{lens\_material\_n}$=the index of refraction at $\lambda_{center}$ of lens 104.

As noted above, the Littrow angle, $\alpha_\lambda$, for transmission grating 108 is defined as:

$$\alpha_\lambda = \sin^{-1}\left(\frac{\lambda_{center} G}{2}\right).$$

As noted above, transmission grating 108 may be pivoted to an angular position to tune laser system 100 over a desired tuning range. Laser system 100 may therefore, for example, be designed such that transmission grating 108 may pivoted to create angles Littrow angles ranging from $\alpha_{min}$ to $\alpha_{max}$, where:

$$\alpha_{min} = \sin^{-1}\left(\frac{\lambda_{min} G}{2}\right)$$

$$\alpha_{max} = \sin^{-1}\left(\frac{\lambda_{max} G}{2}\right)$$

$$\alpha_{center} = \sin^{-1}\left(\frac{\lambda_{center} G}{2}\right)$$

and $$\Delta\alpha_{max}=\alpha_{max}-\alpha_{center}$$

$$\Delta\alpha_{min}=\alpha_{center}-\alpha_{min}$$

To reduce the number of mode hops in laser system 100 over the tuning range, laser system 100 may be designed so that the overall cavity length, L, changes proportionally with the change in the wavelength:

$$\frac{\Delta L}{L_{center}} = \frac{\Delta \lambda}{\lambda_{center}}$$

where
$L_{center}$=Cavity Length of the Laser at $\lambda$center
$\Delta \lambda = \lambda_1 - \lambda_{center}$
$\Delta L = L_1 - L_{center}$ where $L_N$=Cavity Length of the Laser at $\lambda_N$, and
$\lambda_{min} \leq \lambda_N \leq \lambda_{max}$ That is, mode hop free tuning of laser system 100 may be achieved when the cavity length, L, for a new wavelength contains the same mode number as for the starting cavity length, L, for $\lambda_{center}$. The mode number, M, may be defined as the number of half wavelengths that fit into the cavity:

$$M = \frac{L}{\lambda/2} = \frac{2L}{\lambda}$$

Therefore, mode hop free tuning may occur when $M = M_\lambda$ for all $\lambda$ in the tuning range (i.e., M is a constant for all $\lambda$ in the tuning range). Although it may be difficult to have no change in mode number over the tuning range in a Littrow external cavity laser, embodiments of the present invention may be used minimize the number of mode hops by placing the center of rotation for transmission grating 108 at an optimal position.

Figure 3:
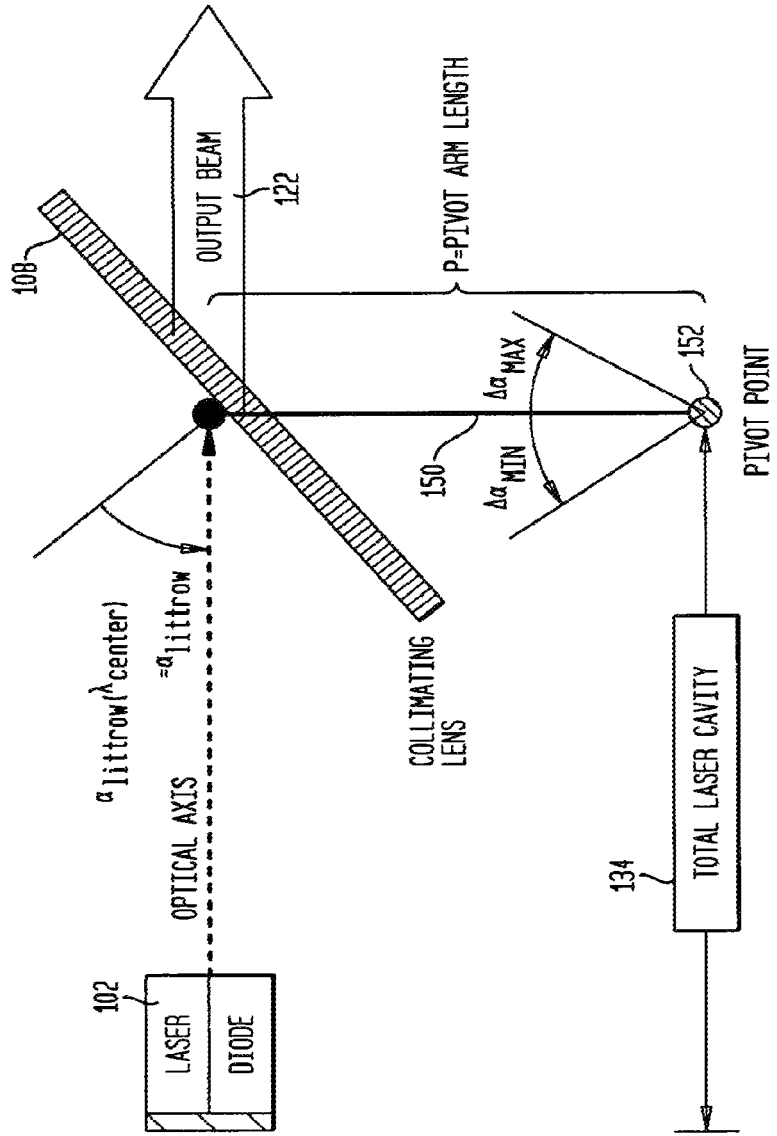
FIG. 3 illustrates a simplified exemplary laser system where the pivot point is located directly below the intercept point on the transmission grating, in accordance with embodiments of methods and systems of the present invention.

FIG. 3 illustrates a simplified version of laser system 100 where the pivot point 152 is located directly below transmission grating 100. In FIG. 3, pivot arm 150 is located at a position for reflecting the center wavelength, $\lambda_{center}$, back along the optical axis so that the center wavelength lases in the optical cavity 134. Also, as illustrated, pivot arm 150 may be rotated counter-clockwise by $\Delta \alpha_{min}$ tilted to adjust the angular position of transmission grating 108 so that the minimum wavelength, $\lambda_{min}$, lases in laser system 100. Further, as shown, pivot arm 150 may rotated clockwise by $\Delta \alpha_{max}$ to adjust the angular position of transmission grating 108 so that the maximum wavelength, $\lambda_{max}$, lases in laser system 100.

As will be described in more detail below, the length, P, of pivot arm 150 may change the total number of mode hops experienced over the tuning range, $\Delta \lambda_{total}$. Thus, it may be advantageous to choose the length, P, to minimize the change in mode hops, M. For small angles of $\Delta \alpha \leq 3°$, the pivot arm length, $P_{best}$, that may result in the fewest number of mode hops, M, may be in the narrow range of $P_{min} < P_{best} < P_{max}$, where $$P_{min} = L \frac{\Delta \lambda_{half}}{\lambda_{center} * \sin(\Delta \alpha_{max})}$$

$$P_{max} = L \frac{\Delta \lambda_{half}}{\lambda_{center} * \sin(\Delta \alpha_{min})},$$

and
$\lambda_{min} = \lambda_{center} - \Delta \lambda_{half}$
$\lambda_{max} = \lambda_{center} + \Delta \lambda_{half}$ Thus, in an embodiment, $P_{min}$ and $P_{max}$ may be calculated and the pivot arm length, P, selected such that it is between $P_{min}$ and $P_{max}$. For example, P may be selected such that $P = (P_{min} + P_{max})/2$.

Figure 4:
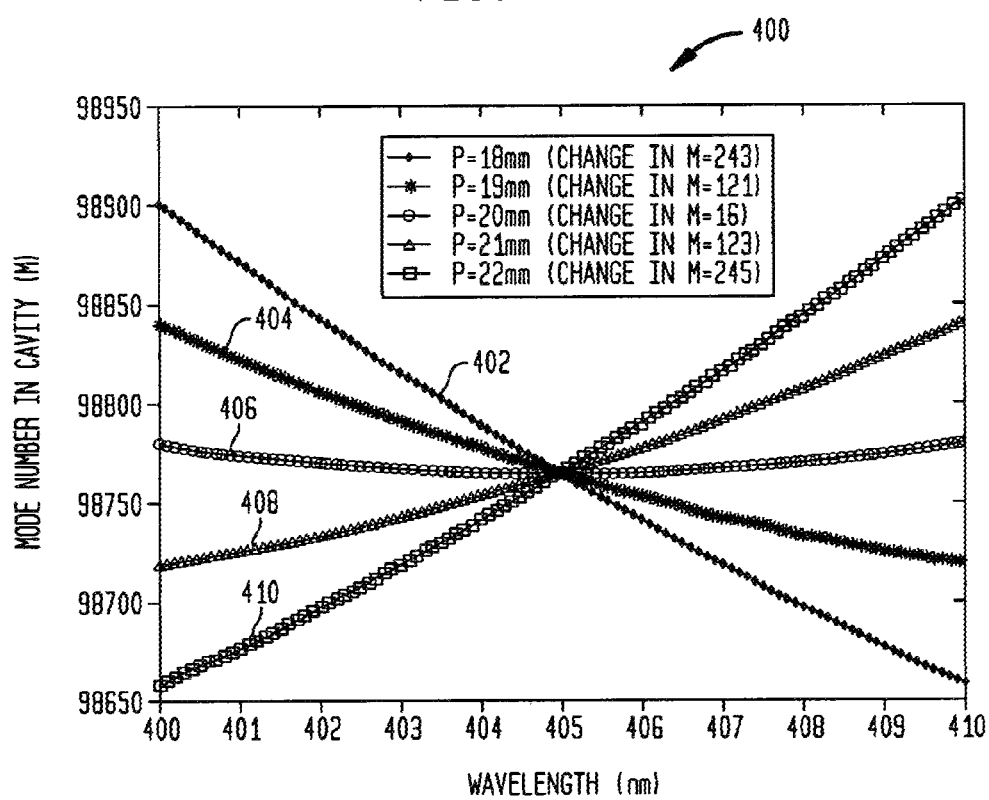
FIG. 4 provides an exemplary plot illustrating mode number, versus wavelength over the tuning range for an exemplary laser system for various lengths of the pivot arm, in accordance with embodiments of methods and systems of the present invention.

FIG. 4 provides an exemplary plot 400 illustrating mode number, M, versus wavelength over the tuning range for an exemplary laser system for various lengths of the pivot arm, P. In the example of FIG. 4, the pivot point may be placed directly below the point at which coherent light beam 120 intercepts transmission grating 108 (referred to hereafter as the "intercept point"). As noted above, the mode number, $M, = L/(\lambda/2)$. Pivot arm 150 moves transmission grating 108 angularly to tune laser system 100. This angular movement of transmission grating 108 may further have the effect of changing the optical cavity length, L, and correspondingly the mode number for the laser system 100 at the tuned wavelength (i.e., the number of half wavelengths at the tuned wavelength that fit in the optical cavity).

FIG. 4 illustrates 5 curves 402, 404, 406, 408, and 410 for various pivot arm lengths and exemplary resulting mode hop numbers, M, in the optical cavity versus wavelength, $\lambda$ for $L_{center}$=20 mm. Particularly, curve 402 illustrates a curve for a pivot arm length, P=18 mm, which in this example results in a change in mode hop numbers of M=243 (i.e., 98900–98657). Curve 404 illustrates a curve for a pivot arm length, P=19 mm, which in this example results in a change in mode hop numbers of M=121 (i.e., 98848–98727). Curve 406 illustrates a curve for a pivot arm length, P=20 mm, which in this example results in a change in mode hop numbers of M=16 (i.e., 98781–98765). Curve 408 illustrates a curve for a pivot arm length, P=21 mm, which in this example results in a change in mode hop numbers of M=123 (i.e., 98848–98725). And, curve 410 illustrates a curve for a pivot arm length, P=22 mm, which in this example results in a change in mode hop numbers of M=245 (i.e., 98902–98657). From FIG. 4, it is apparent that changing the length of the pivot arm, P, may change the total number of mode hops, M, experienced over the tuning range and it may be advantageous to choose the length P to have minimize the change in mode hops, such as, for example, P=20 mm in the example of FIG. 4.

The following provides exemplary computations for calculating a pivot arm length, P, for a tunable laser over a tunable range of from about 400 to about 410 nm ($\Delta \lambda_{total}$=10 nm) with a grating with G=3492 lines/mm (0.003492 lines/nm), and where the center wavelength of tuning range, $\lambda_{center}$=405 nm. Thus, P, may be determined in this example as follows:

$$\Delta \lambda_{half} = \Delta \lambda_{total}/2 = 5 \text{ nm}$$

$$\lambda_{min} = \lambda_{center} - \Delta \lambda_{half} = 400 \text{ nm}$$

$$\lambda_{max} = \lambda_{center} + \Delta \lambda_{half} = 410 \text{ nm}$$

$$\alpha_{min} = \sin^{-1}\left(\frac{\lambda_{min} G}{2}\right) = 44.299°$$

$$\alpha_{max} = \sin^{-1}\left(\frac{\lambda_{max} G}{2}\right) = 45.002°$$

$$\alpha_{center} = \sin^{-1}\left(\frac{\lambda_{center} G}{2}\right) = 45.714°,$$

and $$\Delta \alpha_{max} = \alpha_{max} - \alpha_{center} = 0.712°$$

$$\Delta \alpha_{min} = \alpha_{center} - \alpha_{min} = 0.703°.$$

$$P_{min} = L \frac{\Delta\lambda_{half}}{\lambda_{center} * \sin(\Delta\alpha_{max})} = 0.994L$$

$$P_{max} = L \frac{\Delta\lambda_{half}}{\lambda_{center} * \sin(\Delta\alpha_{min})} = 1.006L$$

The cavity length, $L=L_{center}$, may then be determined as noted above, where L is a function of the central optical ray on a single pass through the cavity starting at the diode:

$$L = \sum_{i=1}^{N} l_i * n_i$$

where $l_i$ is the physical length of the object on the optic axis and $n_i$ is the index of refraction.
Typically,
- i=1 refers to laser diode 102,
- i=2 refers to the air between laser diode's 102 front facet and collimation lens 104,
- i=3 refers to the distance traveled in collimation lens 104 (note: there may be several different air gaps and materials used in the collimation lens), and
- i=4 refer to the air between lens 104 and transmission grating 108 (in its nominal $\lambda_{center}$ position)

such that, as noted above, $$L = (L_{diode}*n_{diode}) + (L_{air}*n_{air})(L_{lens\_material\_n}*n_{lens\_material\_n}),$$

where $L_{air}$ is the combination of the length traveled in air between laser diode 102 and lens 104 and the length traveled in air between lens 104 and transmission grating 108.

For exemplary purposes, in this example, the calculated cavity length, L, will be assumed to be L=20 mm. Thus, $P_{min}$=19.88 mm $P_{max}$=20.12 mm, and 19.88 mm=$P_{min}$<$P_s$<$P_{max}$=20.12 mm, where $P_s$ is the selected pivot arm length.

Figure 5:
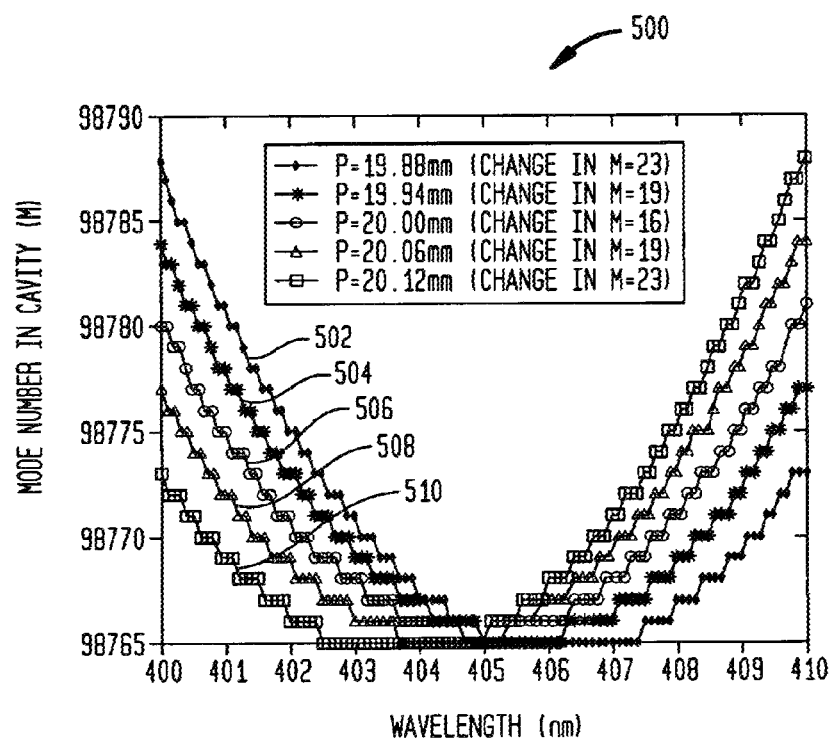
FIG. 5 provides an exemplary plot illustrating mode number, versus wavelength over the tuning range for an exemplary laser system for various lengths of the pivot arm between Pmin and Pmax, in accordance with embodiments of methods and systems of the present invention.

FIG. 5 provides an exemplary plot 500 illustrating mode number, M, versus wavelength over the tuning range for an exemplary laser system for various lengths of the pivot arm between Pmin and Pmax. Particularly, FIG. 5 illustrates 5 curves 502, 504, 506, 508, and 510 for various pivot arm lengths ranging from $P_{min}$=19.88 mm to $P_{max}$=20.12 mm and the corresponding mode hop numbers, M, in the optical cavity versus wavelength, $\lambda$. Particularly, curve 502 illustrates a curve for a pivot arm length, P=19.88 mm, which in this example results in a change in mode hop numbers of M=23 (i.e., 98788–98765). Curve 504 illustrates a curve for a pivot arm length, P=19.94 mm, which in this example results in a change in mode hop numbers of M=19 (i.e., 98784–98765). Curve 506 illustrates a curve for a pivot arm length, P=20.00 mm, which in this example results in a change in mode hop numbers of M=16 (i.e., 98781–98765). Curve 508 illustrates a curve for a pivot arm length, P=20.06 mm, which in this example results in a change in mode hop numbers of M=19 (i.e., 98784–98765). And, curve 510 illustrates a curve for a pivot arm length, P=20.12 mm, which in this example results in a change in mode hop numbers of M=23 (i.e., 98788–98765). From FIG. 5, it is apparent that the length of the pivot arm, P=20.00 mm results in the minimized number of mode hops.

FIG. 5 also illustrates that in this example there is a tolerance in the selected pivot length, P, that may provide good performance even if the selected pivot length, P, of the pivot arm is not the optimum pivot length. For example, as illustrated, selecting any pivot length, P, between $P_{min}$ and $P_{max}$ results in a change in mode hop numbers of less than 23. The curves illustrated by FIGS. 4 and 5 may be determined by, for example, substituting different pivot arm lengths; P, in laser system 100 and determining the mode hops, M, using, for example, a high resolution optical spectrum analyzer that analyzes collimated output laser beam 122.

In another example, the target for the placement of the pivot point 152 may not simply be at a point directly below the intercept point on transmission grating 108 with a length $P_{best}$, but instead the pivot point 152 may be located on a line below the transmission grating 108 on which the pivot point 152 resides. Placing the pivot point 152 on such a line may be useful for tolerancing as well as permitting flexibility of the cavity design, such as, for example, if it is not desirable to place the pivot point 152 directly below the transmission grating 108 intercept point as shown in FIG. 1. For example, in some embodiments, due to spacing requirements, desire for certain length of pivot arm or, for example, a need to place other components directly below the point of intercept, it may be desirable to locate the pivot point 152 at a location other than directly below the point of intercept.

Figure 6:
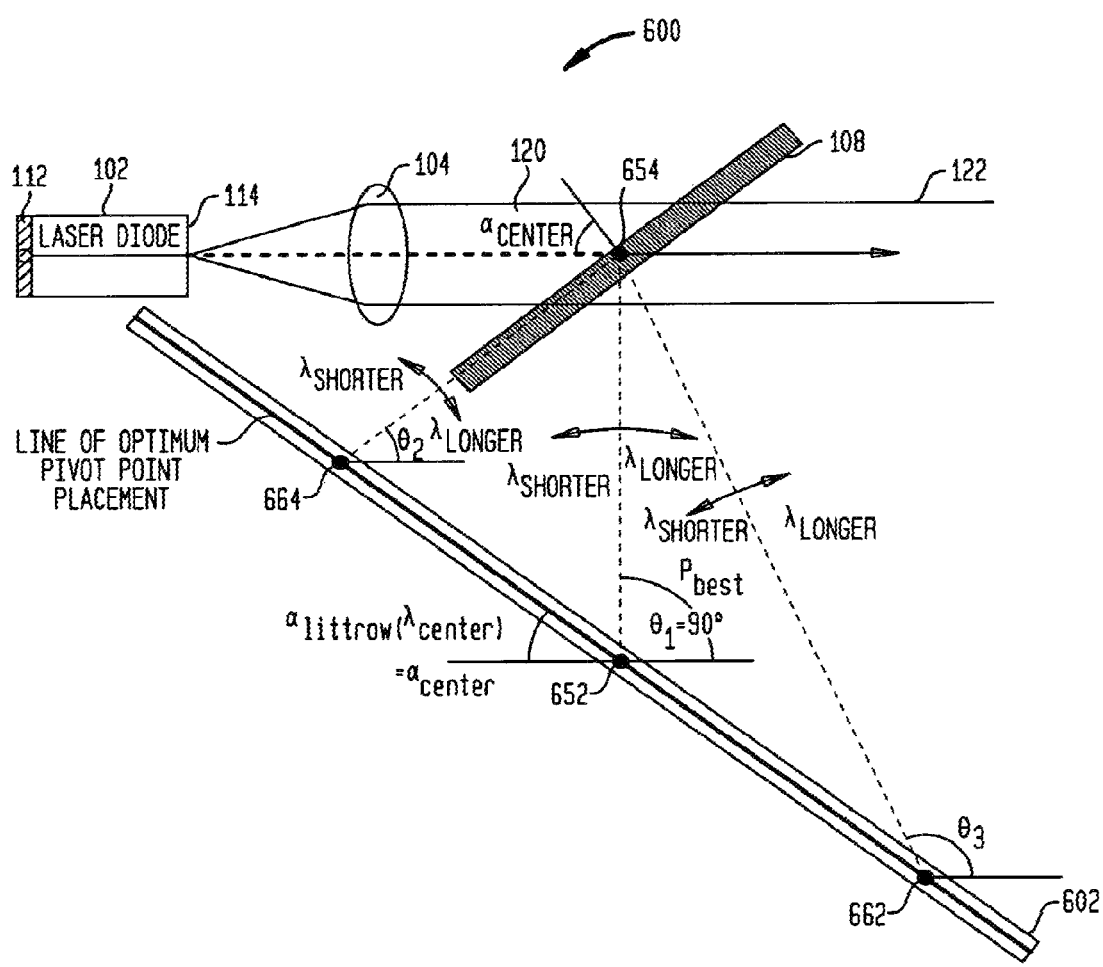
FIG. 6 illustrates a simplified exemplary laser system illustrating various positions for locating the pivot point of a pivot arm, in accordance with embodiments of methods and systems of the present invention.

FIG. 6 illustrates a simplified exemplary laser system 600 illustrating various positions for placing the pivot point. As illustrated, the pivot point may be placed anywhere on a line 602 that passes through the calculated $P_{best}$ for a pivot point 652 located directly below the point 654 on transmission grating 108 where the optical axis of the coherent light beam 120 intercepts transmission grating 108. Further, as illustrated, line 602 has an angle equal to the Littrow angle, $\alpha_\lambda$, for the center wavelength, $\lambda_{center}$. The pivot point may then be located at any position along line 602 and the pivot arm length, P, for the pivot point selected such that it is equal to the distance between line 602 and intercept point 654. For example, FIG. 6 illustrates three possible pivot points, namely, 652, 662, and 664 located on line 602. Further, for example, as illustrated and discussed above with reference to FIGS. 5-6, there is tolerance in the pivot arm length, P, when the pivot point is located directly below the transmission grating intercept point and the pivot arm length, P, is between $P_{min}$ and $P_{max}$. Similarly, there is likewise tolerance in the pivot arm length when the pivot point is located elsewhere along line 602.

In order to improve performance of the laser system, it may also be desirable to be able to adjust the alignment of the laser system's components, such as, for example laser diode 102 and lens 104. For example, in one embodiment, the position and alignment of the laser system's components may be adjusted and the resulting mode hop performance of the laser system measured over the tuning range by analyzing the laser system's output laser beam using, for example, a high resolution optical spectrum analyzer. Such an optical spectrum analyzer may have, for example, a resolution greater than the change in wavelength, $\Delta\lambda$, associated with a mode hop for a fixed cavity length, L, laser system at the center wavelength, $\lambda_{center}$. For example, as noted above, $$\Delta\lambda = \frac{\lambda^2}{2L},$$

which can be converted into frequency terms (e.g., hertz):

$$\Delta v = \frac{c}{2L}$$

where $c=\lambda v$=speed of light=299,792,458 m/sec. Thus, in this example, the high resolution optical spectrum analyzer may have, for example, a resolution (e.g., in terms of hertz) greater than or equal to $\Delta v$=7.5 GHz.

Figure 7:
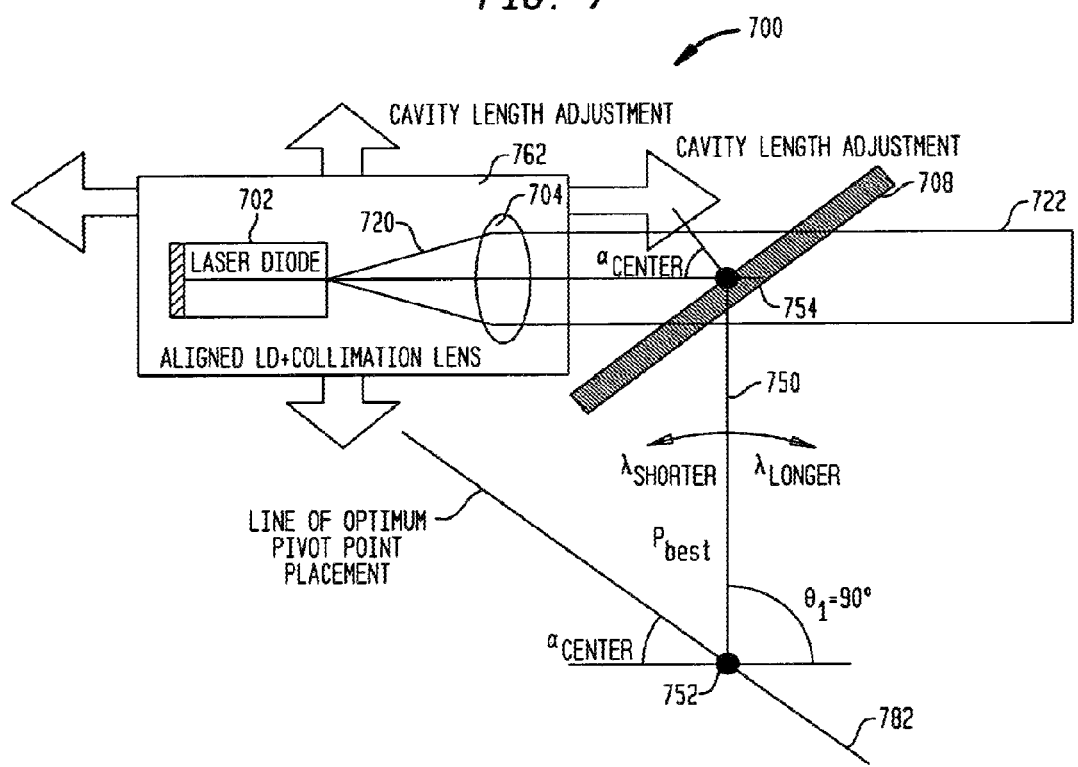
FIG. 7 illustrates an exemplary laser system in which the alignment of the laser system's components may be adjusted, in accordance with embodiments of methods and systems of the present invention.

FIG. 7 illustrates an exemplary laser system in which the alignment of the laser system's components may be adjusted to, for example tune the laser system to improve performance. As illustrated, laser system 700 is similar to laser system 100, but in laser system 700 laser diode 702 and lens 704 are located on a moveable assembly 762. Moveable assembly 762 may, for example, be platform upon which laser diode 702 and lens 704 are mounted. Moveable assembly 762 may also be capable of moving under the control of, for example, a processor, or for example, adjusted manually using, for example, a dial.

Laser system 700 may be initially tuned as follows: First, laser system 700 may be assembled such that pivot arm 750 has a pivot length, P, equal to the optimum length, $P_{best}$, calculated using methods such as those discussed above and the pivot point 752 and transmission grating 708 are located such that the pivot point 752 is located directly beneath the expected intercept point 754 on the transmission grating 708. As noted above, rather than locating the pivot point 752 directly below the intercept point, in other embodiments, the pivot point may located at other locations along a line 782 that passes through pivot point 752 and is at an angle equal to the Littrow angle, $\alpha_\lambda$, for the center wavelength, $\lambda_{center}$, as discussed above with reference to FIG. 6.

Next, laser system 700 may be turned on and the transmission grating 708 pivoted to tune (i.e., obtain lasing) over the tuning range for laser system 700. An optical spectrum analyzer may then be used to determine the number of mode hops over the tuning range by analyzing the output laser beam 722. Next, the position of moveable assembly 762 may be adjusted and the number of mode hops determined over the tuning range for laser system 700. For example, moveable assembly 762 may be moveable up or down and/or to the left or right. Moving moveable assembly 762 may have the effect of altering the cavity length, L. For example, moving moveable assembly 762 down may have the effect of reducing the cavity length, L, by moving the point of intercept of light 720 on transmission grating 708 down and to the left due to the angle of transmission grating 708 in this example. Similarly, moving moveable assembly up or to the left may have the effect of increasing the cavity length, L.

Moveable assembly 762 may then be adjusted and the number of mode hops measured via, for example, an iterative process until a location for moveable assembly 762 is determined that minimizes the number of mode hops over the tuning range of laser system 700. Moveable assembly 762 may then be fixed at this determined location by, for example, tightening screws that may help to fix moveable assembly at this location. This process of determining a position for moveable assembly 762 may be, for example, performed prior to shipment of laser system 700 to customers. Moveable assembly may then remain located at the determined position, for example, for the life of laser system 700 or, for example, this position may be adjusted in the event, for example, errors or problems are determined with laser system 700.

Figure 8A:
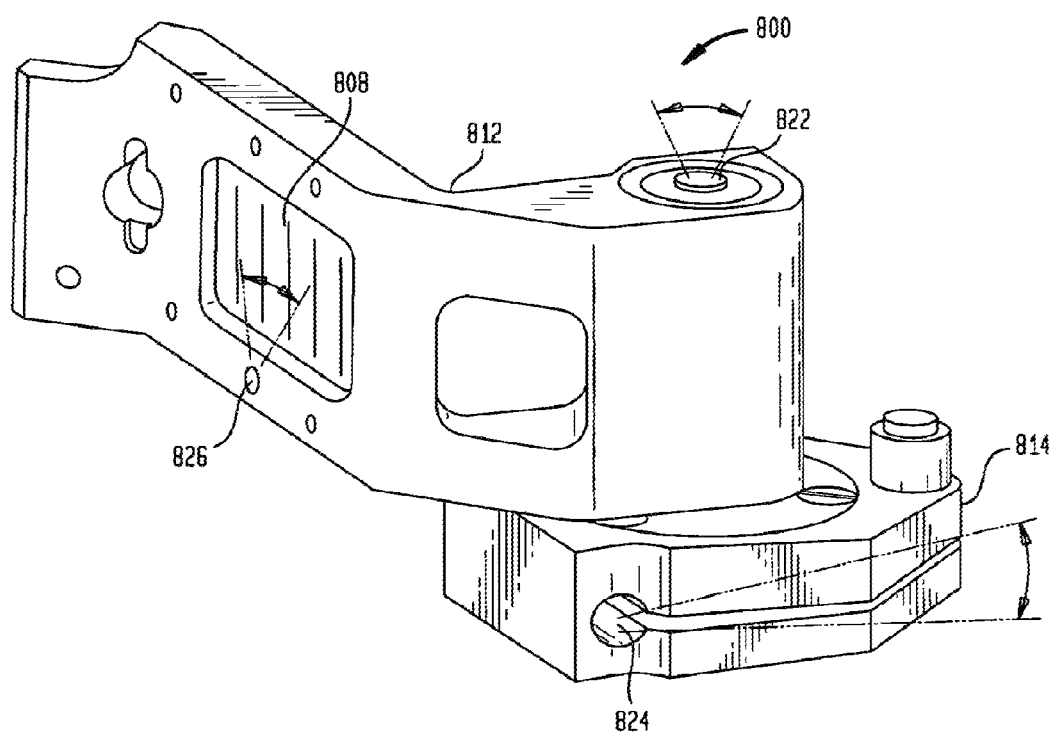
FIGS. 8A and 8B illustrate an exemplary pivot arm with an attached transmission grating, in accordance with embodiments of methods and systems of the present invention.
Figure 8B:
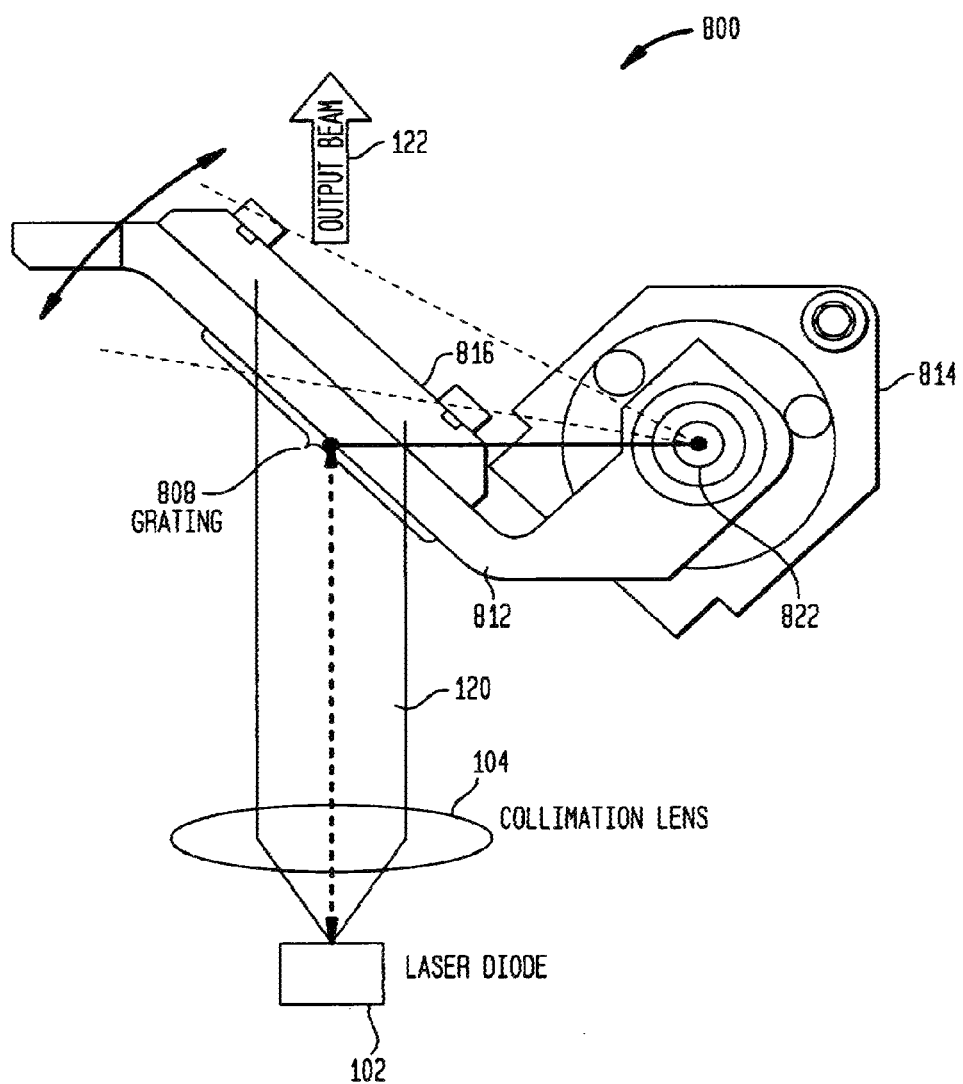

FIGS. 8A and 8B illustrate an exemplary pivot arm with an attached transmission grating, in accordance with embodiments of methods and systems of the present invention. As illustrated in FIG. 8A, pivot arm 800 may comprise a first portion 812 and a second portion 814 and three pivot axes 822, 824, and 826. Transmission grating 808 may be mounted on a mount 816 (see FIG. 8B) that is attached to first portion 812 of pivot arm 800. FIG. 8B also illustrates laser diode 102 and lens 104 for purposes of illustrating how pivot arm 800 may be installed in a laser system such as laser system 100. FIG. 8B also illustrates the effective pivot arm length, P, for pivot arm 800.

FIGS. 9A and 9B illustrate an exemplary mount 816, transmission grating 808 and first portion 812, in accordance with embodiments of methods and systems of the present invention. As illustrated, transmission grating 808 may be installed in mount 816, which may be mounted on first portion 812. Mount 816 may include a hole 902 that aligns on a pin 904 of first portion 812. Pin 904 may function as the third axis of rotation 826, such that the mount 816 may be rotated on first portion 812. Once the desired degree of rotation of mount 816 on first portion 812 is determined, mount 816 may be fixed in location using, for example, screws 908 or other securing mechanisms on mount 816 that attach to corresponding mechanism in first portion 812.

First axis 822 may be used to pivot transmission grating 808 to tune the laser system such as discussed above with reference to laser system 100 of FIG. 1. For example, pivot arm 800 may rotate transmission grating 808 in a counterclockwise direction to reduce the tuned wavelength of the laser system and may rotate transmission grating 808 in a clockwise manner to increase the tuned wavelength. The second axis 824 and third axis 826 may be used to further refine the tuning of the laser system during assembly of the laser system and then the axes 824 and 826 may be fixed during normal operation of the laser system. For example, the second axis 824 may be used to rotate the face of transmission grating 808 to refine the reflection of coherent beam 120 to ensure the transmission grating 808 reflects the desired wavelength directly orthogonal to the rotation axis 822. The third axis 826 may be, for example, used to rotate the transmission grating 808 so that the grating lines of transmission grating are oriented in the direction of the first axis 822. The angle at which portions of pivot arm 800 are rotated about the second and third axes 824 and 826 may be determined by measuring the performance of the laser system at different rotations for these axes and once the optimal position is determined, the second and third axes 824 and 826 may be fixed by, example, tightening corresponding screws so that these axes do not move during normal operation of the laser system.

For example, the optimum position of rotation for the second axis 824 may be determined by iteratively adjusting the angular position of rotation and measuring the optical power of the output laser beam 122. These measurements may be taken, for example, with the first axes or rotation 822 located at its center position so that the laser system is tuned to its center wavelength. The optimum angular position of rotation of the second axis 824 may be determined where the output laser beam 122 is at its maximum power.

The optimum angular position of rotation for the third axis 826 may similarly be, for example, determined by iteratively adjusting the angular position of rotation and measuring the optical power of the output laser beam 122 over the tuning range of the laser system. The optimum angular position of rotation of the third axis 826 may be determined where the output laser beam 122 is at its maximum power across the entire tuning range of the laser system.

A laser system using a pivot arm such as pivot arm 800 may be initially tuned by, for example, first rotating the third axes 826 to align the grating lines of transmission grating 808 so that they are orthogonal to the first axes of rotation 822, as noted above. This may be initially done, for example, without transmission grating 808 being installed in pivot arm 800. Next, transmission grating 808 may be installed and aligned in pivot arm 800. The first axis 822 may then be rotated to tune the laser system at its center wavelength. Then, for example, the rotation for the second axis 824 may be determined such as described above, by using a power meter to measure the output of the output laser beam 122 and fixing the rotation at the position of maximum output power. The laser system may then be tuned across its tuning range and the output laser beam 122 analyzed to ensure optimum performance across the entire tuning range and the second and third axes 824 and 826 adjusted to ensure optimum performance of the laser system across the entire tuning range.

Figure 10A:
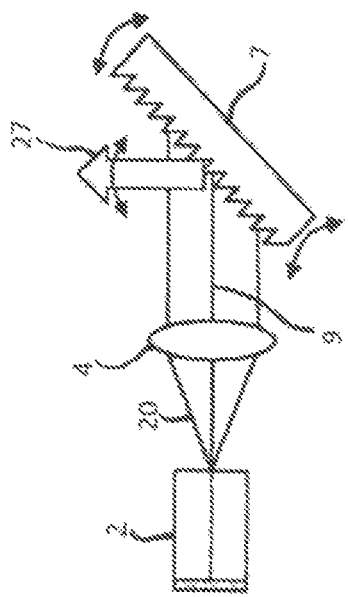
FIG. 10A illustrates an external cavity laser including a reflection diffraction grating, in accordance with embodiments of the present invention.
Figure 10B:
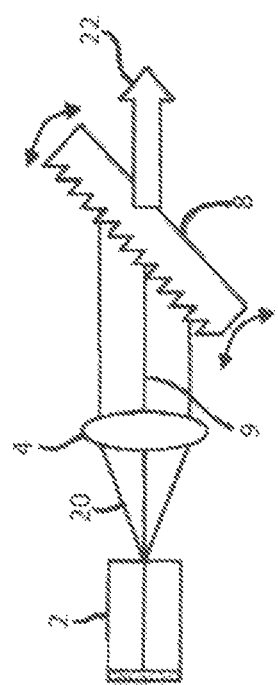
FIG. 10B illustrates an external cavity laser including a transmission diffraction grating, in accordance with embodiments of the present invention.

FIGS. 10A and 10B illustrate embodiments of external cavity lasers comprising a laser diode 2, coherent light beam 20, collimating lens 4, and optical axis 9. Embodiments include diffraction gratings that can be reflective 7, as shown in FIG. 10A, or transmissive 8, as shown in FIG. 10B.

However, there are distinct advantages of using transmissive type gratings. FIGS. 10A and 10B show architectural differences between the two cavity designs. FIG. 10A shows a $0^{th}$ order grating reflection 27 from the reflective diffraction grating 7. The $0^{th}$ order grating reflection 27 has the disadvantage of having beam output angle change with wavelength. FIG. 10B illustrates an embodiment with a transmission diffraction grating 8. Unlike the $0^{th}$ order grating reflection 27 (shown in FIGS. 10A, 11, and 12), a collimated output beam 22 comprising a $0^{th}$ order grating transmission taken from the transmission diffraction grating 8 (shown in FIGS. 10B, 11, and 12 has a beam output angle that does not change with the wavelength of the laser.

Figure 11:
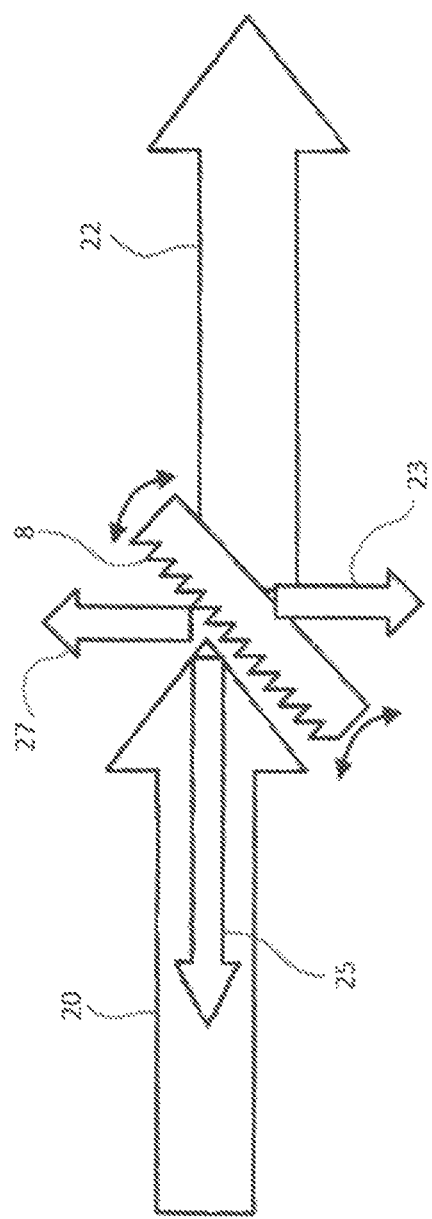
FIG. 11 illustrates a transmission diffraction grating, in accordance with embodiments of the present invention.

As shown in FIGS. 11 and 12, the transmission diffraction grating 8 transmits a first order grating transmission 23 that does not transmit into the collimated output beam 22, in addition to a first order grating reflection 25 comprising a selected wavelength that is reflected by the transmission diffraction grating 8 back into the laser cavity along the optical axis. As best shown in FIG. 12, as the transmission diffraction grating 8 tunes for selected wavelength, first order grating transmission beams 23 converge at a convergence point 29. Accordingly, the convergence point 29 is a good location for a sensor configured to detect beam parameters. The beam parameters typically include one or more of power, wavelength, and longitudinal mode. The convergence point typically resides at a distance from the transmission diffraction grating of L/2, where L=a true optical path length for a photon of a selected wavelength traveling down a center of the laser cavity.

All documents, patents, journal articles and other materials cited in the present application are hereby incorporated by reference.

Although the present invention has been fully described in conjunction with several embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

We claim:

1. A laser system comprising:
a laser cavity including a first end and a second end;
a light source (i) residing within the laser cavity, (ii) providing a coherent light beam, and (iii) including a reflective surface disposed at the first end of the laser cavity;
a lens disposed between the light source and the second end of the laser cavity, the lens being configured to collimate the coherent light beam to provide a collimated coherent light beam;
a diffraction grating disposed at the second end of the laser cavity, the diffraction grating having an angular position relative to the collimated light beam that results in the diffraction grating reflecting a selected wavelength of the collimated coherent light beam through the lens to the first end of the laser cavity;
a pivot arm connected to the diffraction grating, the pivot arm and the diffraction grating being configured to change the angular position of the diffraction grating relative to the collimated coherent light beam upon rotation of the pivot arm about a rotational axis; and
a sensor;
wherein:
the reflective surface reflects the selected wavelength of the collimated coherent light beam through the lens toward the diffraction grating;
a $0^{th}$ order grating transmission of the collimated coherent light beam is transmitted by the diffraction grating to provide a collimated output beam disposed at an output angle relative to the collimated coherent light beam;
the rotation of the pivot arm about the rotational axis results in the diffraction grating reflecting a new selected wavelength of the collimated coherent light beam through the lens to the first end of the laser cavity;
the output angle of the collimated output beam remains the same whether the selected wavelength or the new selected wavelength is reflected by the diffraction grating through the lens to the first end of the laser cavity;
a grating transmission of the selected wavelength of the collimated coherent light beam is transmitted by the diffraction grating along a transmission path, thereby providing a transmission beam for beam monitoring;
the transmission beam does not transmit into the collimated output beam; and
the sensor resides in the transmission path and is configured to detect one or more parameters of the transmission beam.

2. The laser system of claim 1, wherein the sensor further resides at a convergence point of the transmission beam.

3. The laser system of claim 1, wherein the sensor further resides at a distance of L/2 from the diffraction grating, L being a true optical path length for a photon of the selected wavelength traveling down a center of the laser cavity.

4. The laser system of claim 2, wherein the one or more parameters of the transmission beam is selected from the group consisting of power, wavelength, and laser longitudinal mode.

5. The laser system of claim 3, wherein the one or more parameters of the transmission beam is selected from the group consisting of power, wavelength, and laser longitudinal mode.

* * * * *